US012684775B2

(12) United States Patent
Kim

(10) Patent No.: US 12,684,775 B2
(45) Date of Patent: Jul. 14, 2026

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 453 days.

(21) Appl. No.: 18/310,353

(22) Filed: May 1, 2023

(65) Prior Publication Data

US 2024/0172440 A1     May 23, 2024

(30) Foreign Application Priority Data

Nov. 18, 2022     (KR) ........................ 10-2022-0155420

(51) Int. Cl.
| | |
|---|---|
| *H10B 43/27* | (2023.01) |
| *H10B 41/27* | (2023.01) |
| *H10B 41/50* | (2023.01) |
| *H10B 43/10* | (2023.01) |
| *H10B 43/35* | (2023.01) |
| *H10B 43/40* | (2023.01) |
| *H10B 43/50* | (2023.01) |

(52) U.S. Cl.
CPC ............. *H10B 43/27* (2023.02); *H10B 41/27* (2023.02); *H10B 41/50* (2023.02); *H10B 43/10* (2023.02); *H10B 43/35* (2023.02); *H10B 43/40* (2023.02); *H10B 43/50* (2023.02)

(58) Field of Classification Search
CPC ........ H10B 43/27; H10B 41/27; H10B 41/50; H10B 43/10; H10B 43/40; H10B 43/50; H10B 43/35; H10B 41/10

USPC .......................................................... 257/324
See application file for complete search history.

(56) References Cited

U.S. PATENT DOCUMENTS

| | | | | |
|---|---|---|---|---|
| 8,664,761 | B1 * | 3/2014 | Hu ..................... | H01L 21/76831 |
| | | | | 257/737 |
| 8,822,285 | B2 * | 9/2014 | Hwang ................. | H10B 41/27 |
| | | | | 438/257 |
| 9,437,483 | B2 * | 9/2016 | Lee ........................ | H10B 43/50 |
| 9,455,268 | B2 * | 9/2016 | Oh .......................... | H10B 43/50 |
| 9,831,121 | B2 * | 11/2017 | Okawa ................... | H10B 43/35 |
| 9,865,540 | B2 * | 1/2018 | Kim ................. | H01L 21/76877 |

(Continued)

FOREIGN PATENT DOCUMENTS

| | | |
|---|---|---|
| KR | 1020210015422 A | 2/2021 |
| KR | 1020210054373 A | 5/2021 |

*Primary Examiner* — Vu A Vu
(74) *Attorney, Agent, or Firm* — WILLIAM PARK AND ASSOCIATES LTD.

(57)     ABSTRACT

There are provided a semiconductor memory device and a manufacturing method of the semiconductor memory device. The semiconductor memory device includes a stack structure including interlayer insulating layers and conductive layers, which are alternately stacked therein; and a plurality of contact plugs formed vertically on the conductive layers. The stack structure is configured to have a stepped structure, and each of a plurality of steps included in the stepped structure includes at least two interlayer insulating layers, among the interlayer insulating layers, and at least two conductive layers, among the conductive layers. The plurality of contact plugs include at least two contact plugs respectively connected to the at least two conductive layers included in each of the plurality of steps.

17 Claims, 26 Drawing Sheets

(56) References Cited

U.S. PATENT DOCUMENTS

| | | | |
|---|---|---|---|
| 10,032,791 B2 * | 7/2018 | Lee | H10D 30/6892 |
| 11,018,153 B2 * | 5/2021 | Kai | H10D 62/292 |
| 11,107,765 B2 * | 8/2021 | Lee | H01L 21/76816 |
| 11,450,610 B2 * | 9/2022 | Hyun | H10B 43/27 |
| 11,588,035 B2 * | 2/2023 | Lee | H10B 43/50 |
| 2013/0009274 A1 * | 1/2013 | Lee | H10B 43/27 |
| | | | 257/E21.209 |
| 2014/0197546 A1 * | 7/2014 | Hwang | H10B 41/50 |
| | | | 257/774 |

* cited by examiner

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2022-0155420 filed on Nov. 18, 2022, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A memory device may be classified into a volatile memory device in which data disappears when power supply is interrupted and a non-volatile memory device in which data is retained even when power supply is interrupted.

The nonvolatile memory device is provided in a cell string structure in which a plurality of memory cell transistors are connected in series. Thus, the nonvolatile memory device is advantageous in high integration. Accordingly, the nonvolatile memory device can be mainly used for portable electronic products. For example, since memory devices used for mobile phones require low power and high degree of integration, the nonvolatile memory device may be mainly used as the memory devices used for the mobile phones. The nonvolatile memory device may be used for mass storage devices, such as servers, in addition to portable electronic products.

SUMMARY

In accordance with an aspect of the present disclosure, there is provided a semiconductor memory device including a stack structure including interlayer insulating layers and conductive layers, which are alternately stacked therein; and a plurality of contact plugs formed vertically on the conductive layers, wherein the stack structure is configured to have a stepped structure, wherein each of a plurality of steps included in the stepped structure includes at least two interlayer insulating layers among the interlayer insulating layers and at least two conductive layers among the conductive layers, and wherein the plurality of contact plugs include at least two contact plugs respectively connected to the at least two conductive layers included in each of the plurality of steps.

In accordance with another aspect of the present disclosure, there is provided a semiconductor memory device including a stack structure including a slimming region, the slimming region of the stack structure having a stepped structure; and a first contact plug and a second contact plug in contact with a plurality of steps included in the stepped structure, the first contact plug and the second contact plug having different lengths, wherein the stack structure includes: a first conductive layer in contact with the first contact plug; and a second conductive layer, spaced apart from the first conductive layer, in contact with the second contact plug.

In accordance with still another aspect of the present disclosure, there is provided a method of manufacturing a semiconductor memory device, the method including forming a stack structure including first and second conductive layers on a lower structure; etching the stack structure to form a stepped structure including steps in which the first and second conductive layers are included; forming an upper insulating layer on the top of the stack structure having the stepped structure; forming a plurality of first holes that expose the second conductive layers while penetrating the upper insulating layer; forming a plurality of second holes that expose the first conductive layers while penetrating the second conductive layers; forming a sidewall insulating layer on sidewalls of the second holes; and forming a plurality of first contact plugs and a plurality of second contact plugs inside the plurality of first holes and inside the plurality of second holes, respectively.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 4A and 4B are perspective views illustrating a portion of a semiconductor memory device in accordance with an embodiment of the present disclosure.

FIGS. 7A, 7B, 8A, 8B, 9A, 9B, 10A, 10B, 11A, 11B, 12A, 12B, 13A, 13B, 14A, 14B, 15A, and 15B are views illustrating a manufacturing method of a semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure.

Embodiments provide a semiconductor memory device and a manufacturing method of the semiconductor memory device, which can increase the stability of a manufacturing process and improve operational stability.

Figure 1:
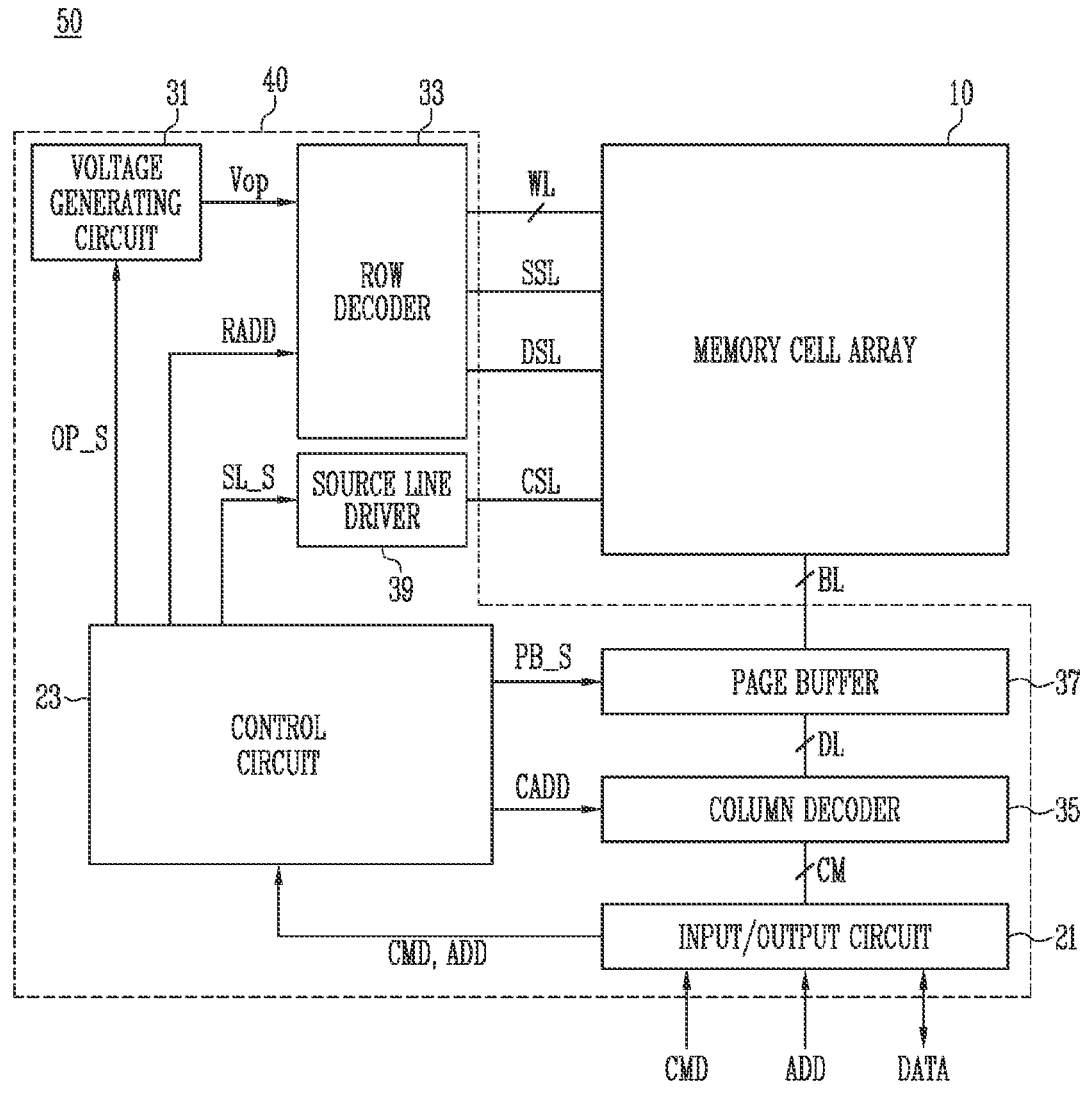
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erasing data stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may be connected to a drain select line DSL, a plurality of word lines WL, a source select line SSL, a plurality of bit lines BL, and a common source line CSL.

The input/output circuit 21 may transfer, to the control circuit 23, a command CMD and an address ADD that are received from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select line DSL, the word lines WL, and the source select line SSL in response to the row address RADD.

The column decoder 35 may transmit data DATA, input from the input/output circuit 21, to the page buffer 37 or transmit data DATA, stored in the page buffer 37, to the input/output circuit 21 in response to the column address CADD. The column decoder 35 may exchange data DATA with the input/output circuit 21 through a column line CM. The column decoder 35 may exchange data DATA with the page buffer through a data line DL.

The page buffer 37 may temporarily store data DATA received through the bit line BL in response to the page buffer control signal PB_S. The page buffer 37 may sense a voltage or current of the bit line BL in a read operation.

The source line driver 39 may control a voltage applied to the common source line CSL in response to the source line control signal SL_S.

In order to improve the degree of integration of the semiconductor memory device, the memory cell array 10 may overlap with the peripheral circuit structure 40.

Figure 2:
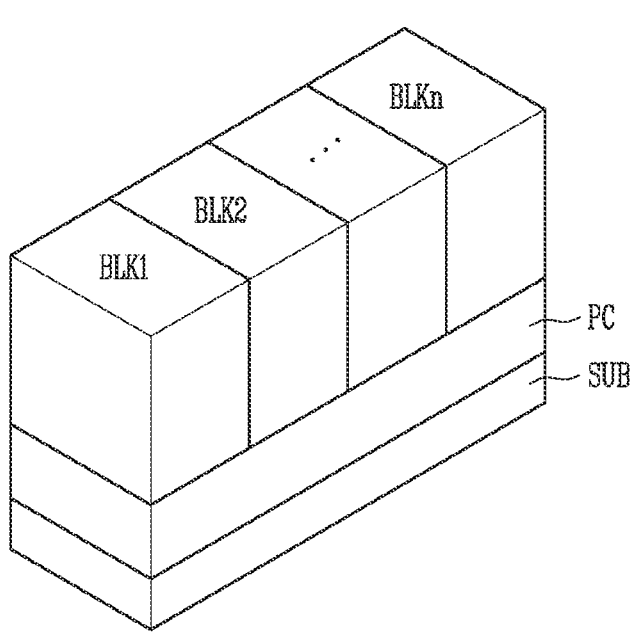
FIG. 2 is a block diagram schematically illustrating a semiconductor memory device in accordance with an embodiment of the present disclosure.

FIG. 2 is a block diagram schematically illustrating a semiconductor memory device in accordance with an embodiment of the present disclosure.

Referring to FIG. 2, the semiconductor memory device may include a peripheral circuit structure PC and memory blocks BLK1 to BLKn, which are disposed on a substrate SUB. The memory blocks BLK1 to BLKn may overlap with the peripheral circuit structure PC.

The substrate SUB may be a single crystalline semiconductor layer. For example, the substrate SUB may be a bulk silicon substrate, a silicon-on-insulator substrate, a germanium substrate, a germanium on insulator substrate, a silicon-germanium substrate, or an epitaxial thin film formed through a selective epitaxial growth process.

The peripheral circuit structure PC may include a row decoder, a column decoder, a page buffer, a control circuit, and the like, which constitute a circuit for controlling operations of the memory blocks BLK1 to BLKn. For example, the peripheral circuit structure PC may include an NMOS transistor, a PMOS transistor, a resistor, a capacitor, and the like, which are electrically connected to the memory blocks BLK1 to BLKn. The peripheral circuit structure PC may be disposed between the substrate SUB and the memory blocks BLK1 to BLKn.

Each of the memory blocks BLK1 to BLKn may include a source structure, bit lines, cell strings electrically connected to the source structure and the bit lines, word lines electrically connected to the cell strings, and select lines electrically connected to the cell strings. Each of the cell strings may include memory cells and select transistors, which are connected in series by a channel layer. Each of the select lines may be used as a gate electrode of a select transistor corresponding thereto, and each of the word lines may be used as a gate electrode of a memory cell corresponding thereto.

In another embodiment, the substrate SUB, the peripheral circuit structure PC, and the memory blocks BLK1 to BLKn may be stacked in a reverse order of the order as shown in FIG. 1. The peripheral circuit structure PC may be disposed on the memory blocks BLK1 to BLKn.

Figure 3:
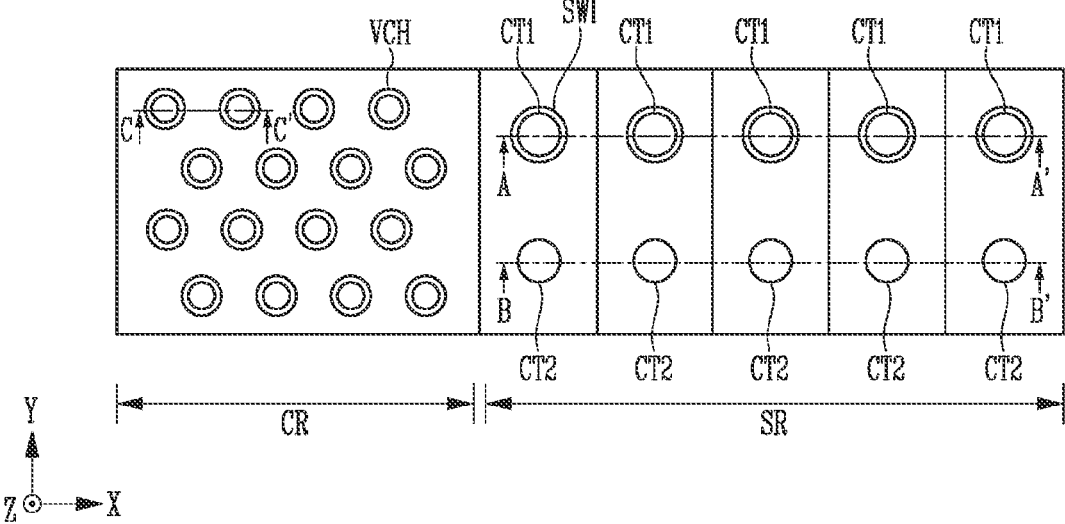
FIG. 3 is a view illustrating a layout of a cell region and a slimming region.

FIG. 3 is a view illustrating a layout of a cell region and a slimming region.

Referring to FIG. 3, a plurality of vertical channel structures VCH may be formed in a cell region CR, and first contact plugs CT1 and second contact plugs CT2 may be formed in a slimming region SR. The slimming region SR may extend from the cell region CR. The cell region CR and the slimming region SR may have a stack structure stacked in a Z direction, and the stack structure may be a step-like (stepped) structure having a plurality of steps in the slimming region SR.

The vertical channel structures VCH may vertically penetrate the stack structure stacked in the Z direction in the cell region CR and may include a plurality of memory cells.

The first contact plugs CT1 and the second contact plugs CT2 may respectively correspond to the plurality of steps included in the stepped structure in the slimming region SR. The first contact plugs CT1 and the second contact plugs CT2 may have different lengths in the Z direction. The first contact plugs CT1 may be surrounded with a sidewall insulating layer SWI. A detailed structure of the first contact plugs CT1 and the second contact plugs CT2 will be described below with reference to FIGS. 4A and 4B.

The number of vertical channel structures VCH, the first contact plugs CT1, and the second contact plugs CT2 might not be limited to the numbers as shown in FIG. 3, and may vary according to the size of a memory block and the number of stacked layers included in the stack structure.

In the following embodiment, a structure and a manufacturing method of the first contact plugs CT1 will be described using a section taken along line A-A', and a structure and a manufacturing method of the second contact plugs CT2 will be described using a section taken along line B-B'. A structure of the vertical channel structures VCH will be described using a section taken along line C-C'.

Figure 4A:
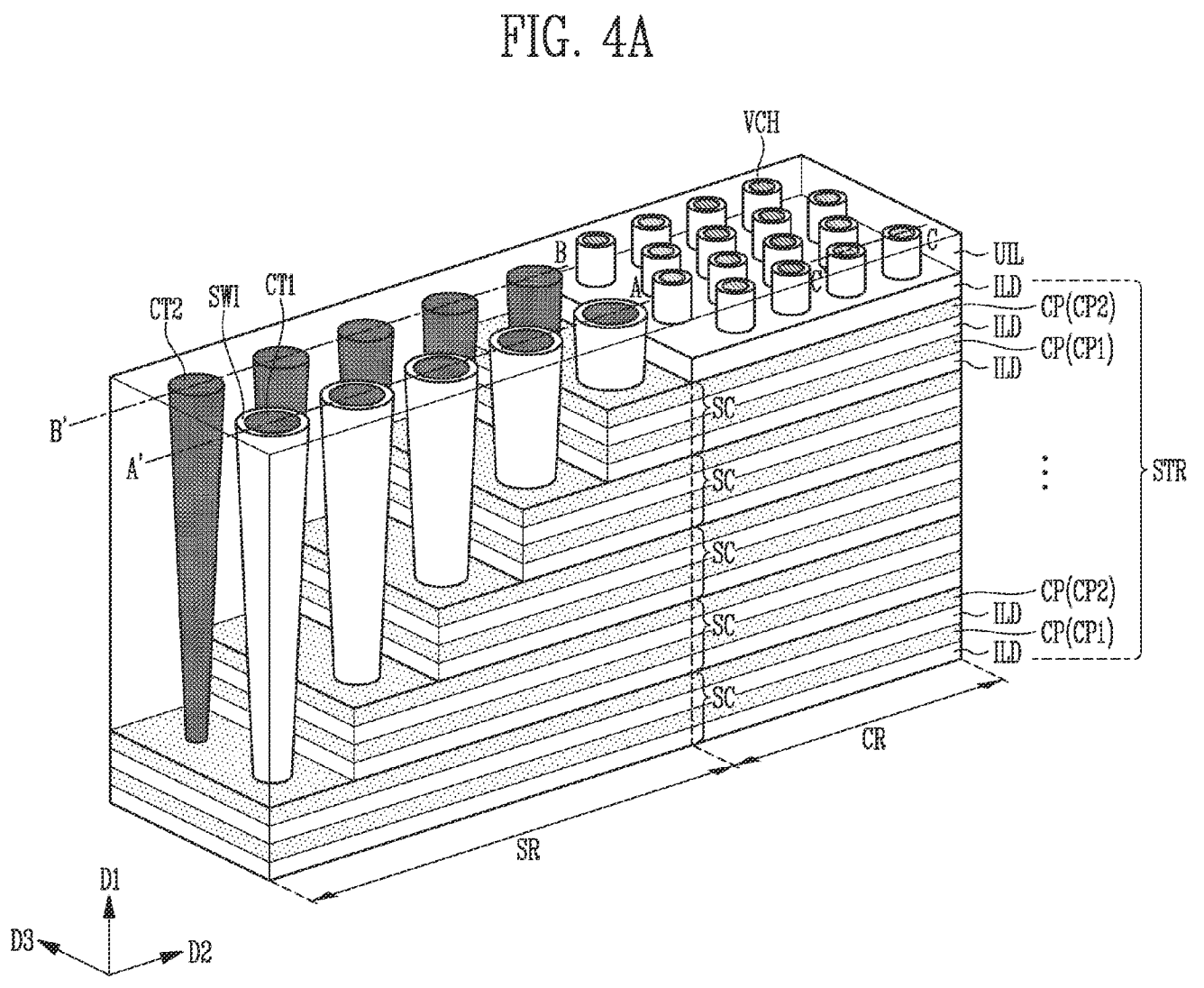
Figure 4B:
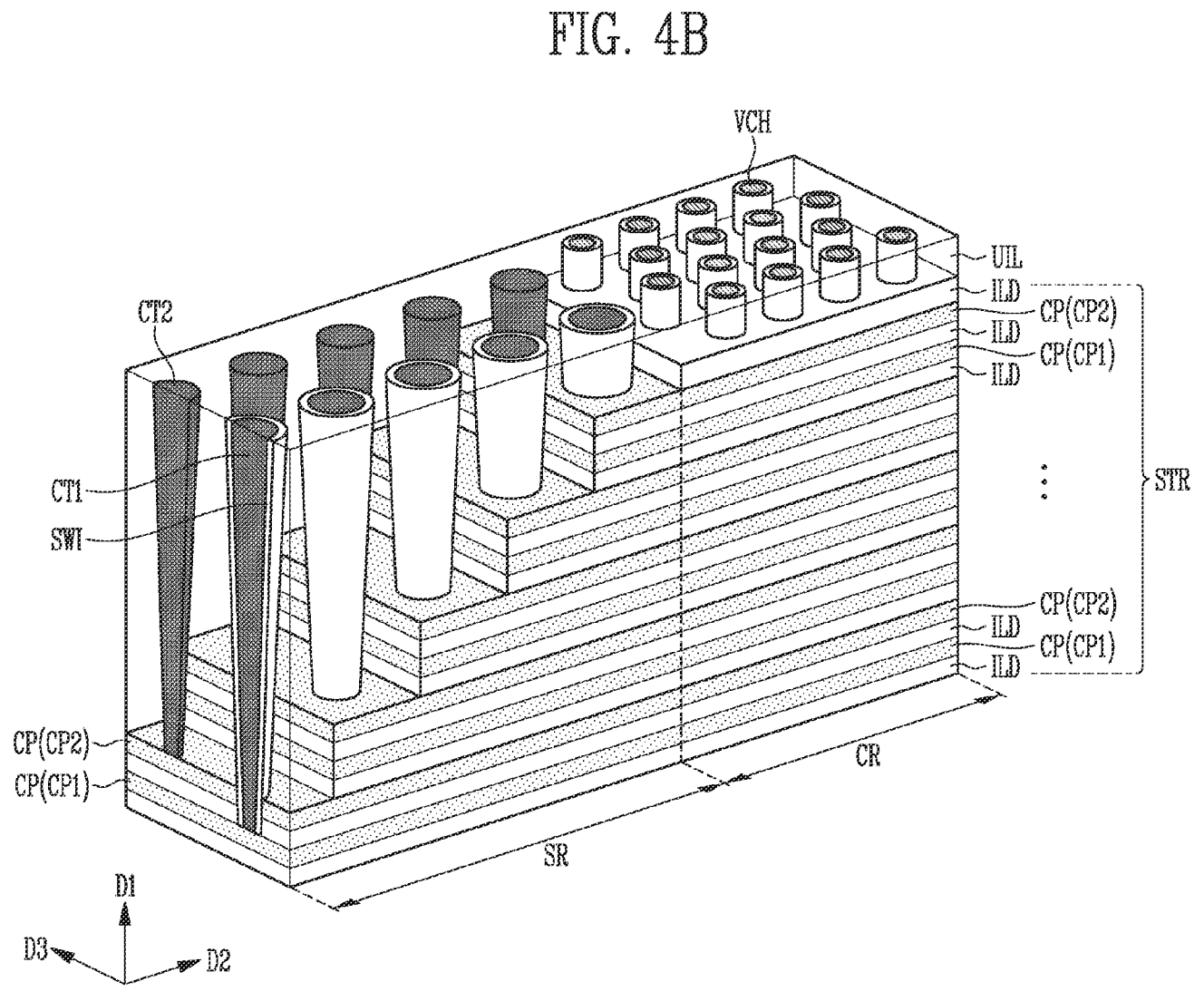

FIGS. 4A and 4B are perspective views illustrating a portion of a semiconductor memory device in accordance with an embodiment of the present disclosure.

Referring to FIG. 4A, the semiconductor memory device may include a cell region CR and a slimming region SR. The semiconductor memory device may include a stack structure STR and vertical channel structure VCH in the cell region CR. The semiconductor memory device may include the stack structure STR and contact plugs CT1 and CT2 in the slimming region SR.

The stack structure STR may be formed such that interlayer insulating layers ILD and conductive layers CP are alternately stacked in a first direction D1. The interlayer insulating layers ILD and conductive layers CP of the stack structure STR may extend in a second direction D2 and a third direction D3. The stack structure STR may be provided in a form surrounding the vertical channel structures VCH in the cell region CR. The stack structure STR may include a stepped structure having a plurality of steps SC extending in the second direction D2 in the slimming region SR.

One step SC among the plurality of steps SC may include at least two interlayer insulating layers ILD, among the interlayer insulating layers ILD, and at least two conductive layers CP, among the conductive layers CP.

The at least two conductive layers CP included in the one step SC may include a first conductive layer CP1 and a second conductive layer CP2. The first conductive layer CP1 and the second conductive layer CP2, which are included in the one step SC, may be disposed to be spaced apart from each other in the first direction D1. The first conductive layer CP1 and the second conductive layer CP2, which are included in the one step SC, may extend with the substantially same length in the second direction D2. An edge of the first conductive layer CP1 included in the one step SC and an edge of the second conductive layer CP2 included in the one step SC may be disposed to be aligned along a sidewall of the step SC.

The stack structure STR may be covered with an upper insulating layer UIL. The upper insulating layer UIL may cover the stepped structure. The upper insulating layer UIL may fill a space between the vertical channel structures VCH and a space between the first contact plugs CT1 and the second contact plugs CT2. The upper insulating layer UIL may have a substantially flat surface.

The vertical channel structures VCH may penetrate the stack structure STR. The vertical channel structures VCH may extend in the first direction D1. The vertical channel structures VCH may be disposed to be spaced apart from each other in the second direction D2 and the third direction D3.

Referring to FIGS. 4A and 4B, the contact plugs CT1 and CT2 may be connected to the conductive layers CP of the stack structure STR. The contact plugs CT1 and CT2 may include first contact plugs CT1 and second contact plugs CT2, which correspond to one step SC of the stepped structure and are formed with different lengths. The first contact plugs CT1 and the second contact plugs CT2 may extend in the first direction D1 from the tops of the plurality of steps SC of the stepped structure.

In an embodiment, when the at least two conductive layers CP included in the one step SC are a first conductive layer CP1 and a second conductive layer CP2, the first contact plug CT1 may be connected to the second conductive layer CP2, and the second contact plug CT2 may be connected to the first conductive layer CP1.

In another embodiment, as shown in the drawings, the first contact plug CT1 may be connected to the first conductive layer CP1, and the second contact plug CT2 may be connected to the second conductive layer CP2. Hereinafter, the structure shown in the drawings will be mainly described.

Figure 5A:
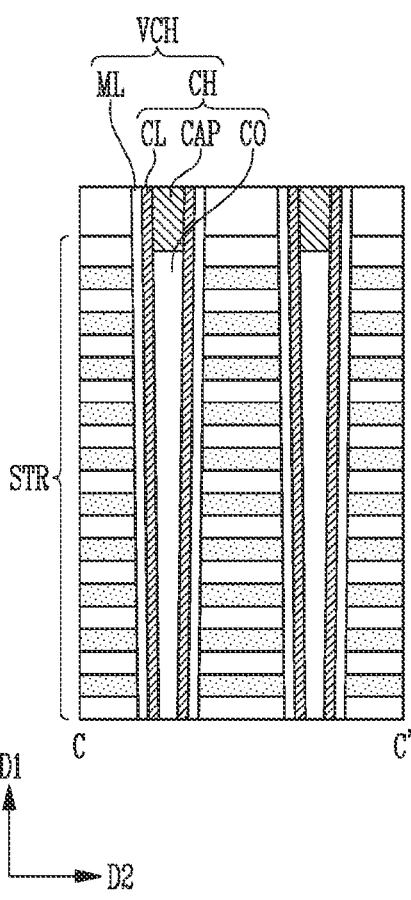
FIGS. 5A and 5B are sectional views of the semiconductor memory device shown in FIG. 4A.
Figure 5B:
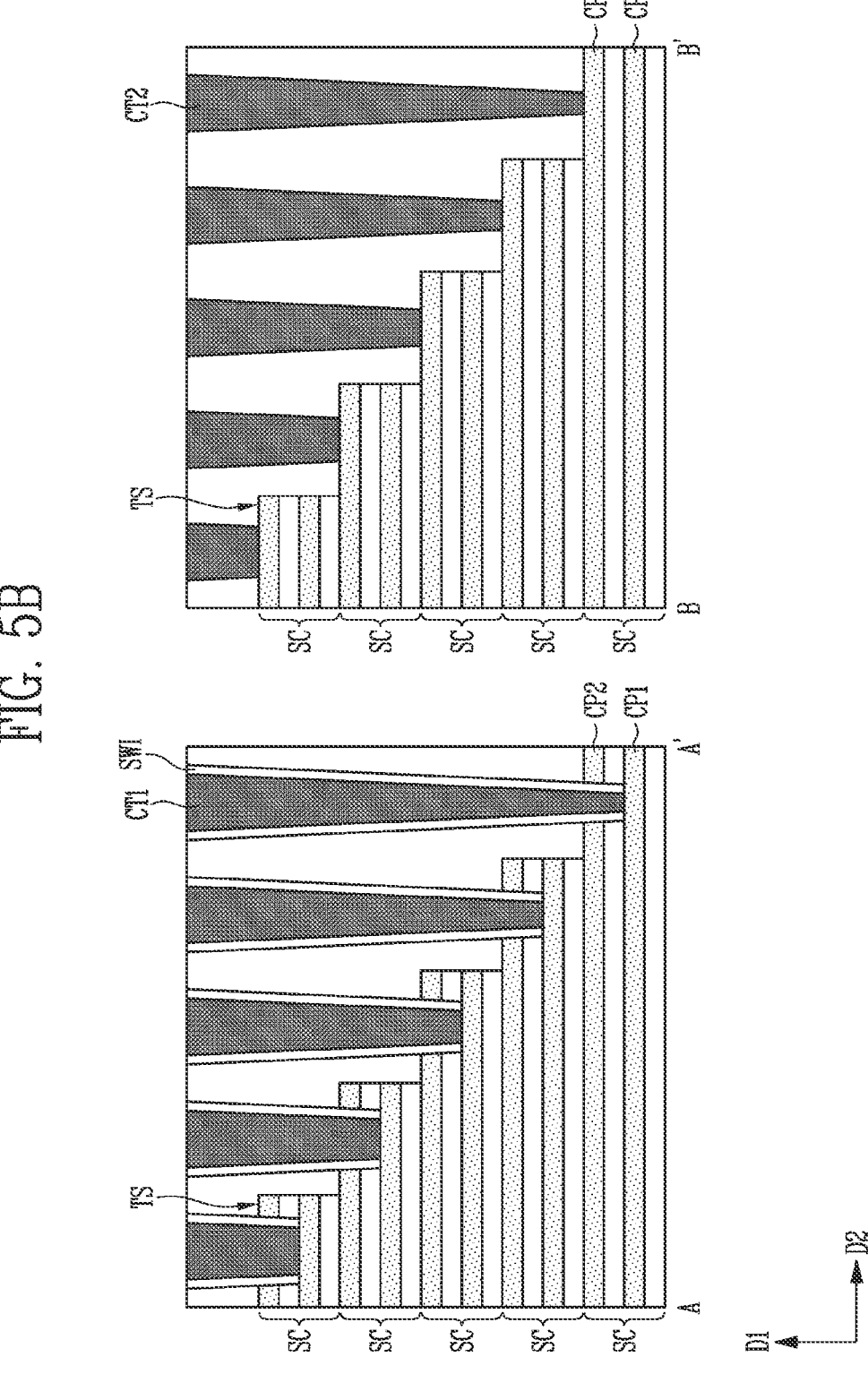

FIGS. 5A and 5B are sectional views of the semiconductor memory device shown in FIG. 4A. More specifically, FIGS. 5A and 5B are sectional views taken along the lines A-A', B-B', and C-C'. Hereinafter, detailed descriptions of components overlapping with those shown in FIGS. 4A and 4B will be omitted.

Referring to FIGS. 5A and 5B, the semiconductor memory device may include vertical channel structures VCH, first contact plugs CT1, and second contact plugs CT2.

Referring to FIG. 5A, each of the vertical channel structures VCH may include a channel structure CH and a memory layer ML. The channel structure CH may include a core pillar CO forming a central region of the channel structure CH, and a channel layer CL and a capping pattern CAP, which surround the core pillar CO. The memory layer ML may be surround the channel structure CH. The memory layer ML may surround the channel layer CL. The channel layer CL may be used as a channel region of a memory cell string corresponding thereto. In an embodiment, the channel layer CL may include silicon. The capping pattern CAP may be configured with silicon, germanium, or a combination thereof, which include a dopant for junctions. The dopant for junctions may include at least one of an n-type impurity and a p-type impurity. In an embodiment, the capping pattern CAP may be configured with n-type doped silicon.

Referring to FIG. 5B, the conductive layers CP may be connected to the peripheral circuit structure PC as shown in FIG. 2, through the first contact plugs CT1 and the second contact plugs CT2.

The tops of the steps SC in the stepped structure of the stack structure STR may be top surfaces TS of the second conductive layers CP2.

The first contact plugs CT1 may be surrounded by the second conductive layer CP2. The first contact plugs CT1 may further include a sidewall insulating layer SWI surrounding sidewalls of the first contact plugs CT1. The first contact plug CT1 may be surrounded by the second conductive layer CP2 with the sidewall insulating layer SWI interposed therebetween. The sidewall insulating layer SWI may prevent the first contact plugs CT1 and the second conductive layers CP2 to be electrically short-circuited with each other.

The second contact plug CT2 may be connected to the top surface TS of the second conductive layer CP2. The second contact plug CT2 may be disposed to be spaced apart from the first conductive layer CP1 in the first direction D1.

The first contact plug CT1 and the second contact plug CT2, which are disposed in the same step SC, may be electrically connected respectively to the first conductive layer CP1 and the second conductive layer CP2. Thus, a defect which may occur when the stepped structure is formed in the third direction D3 in addition to the second direction D2, described with reference to FIG. 5A, can be reduced, and the operational reliability of the semiconductor memory device can be improved.

Figure 6:
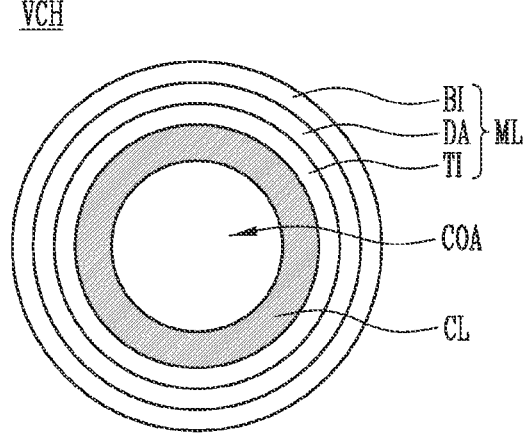
FIG. 6 is a view illustrating a cross-section of a vertical channel structure shown in FIG. 5A.

FIG. 6 is a view illustrating a cross-section of the vertical channel structure VCH shown in FIG. 5A.

Referring to FIG. 6, the channel layer CL of the vertical channel structure VCH may be formed in an annular shape defining a core region COA. The core region COA may be filled with the core pillar CO as shown in FIG. 5A. The memory layer ML of the vertical channel structure VCH may include a tunnel insulating layer TI, a data storage layer DA, and a blocking insulating layer BI, which are sequentially stacked on a surface of the channel layer CL.

The data storage layer DA may be formed of a material layer capable of storing data, changed using Fowler-Nordheim tunneling. To this end, the data storage layer DA may be formed of various materials. For example, the data storage layer DA may be formed of a nitride layer capable of trapping charges. However, the present disclosure is not limited thereto, and the data storage layer DA may include silicon, a phase change material, a nano dot, and the like. The blocking insulating layer BI may include an oxide layer capable of blocking movement of charges. The tunnel insulating layer TI may be formed of a silicon oxide layer through which charges can tunnel.

Hereinafter, a manufacturing method of a semiconductor memory device in accordance with an embodiment of the present disclosure will be described based on the slimming region (SR shown in FIG. 3).

Figure 7A:
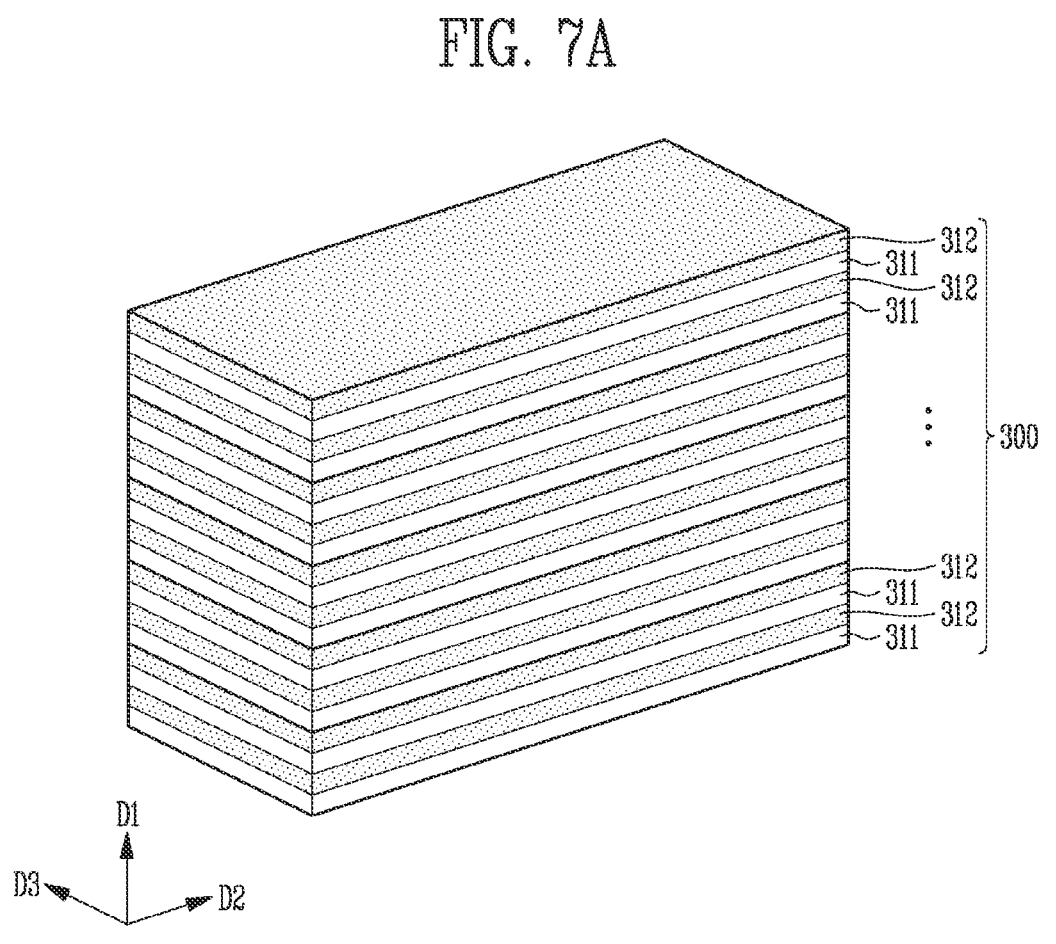
Figure 7B:
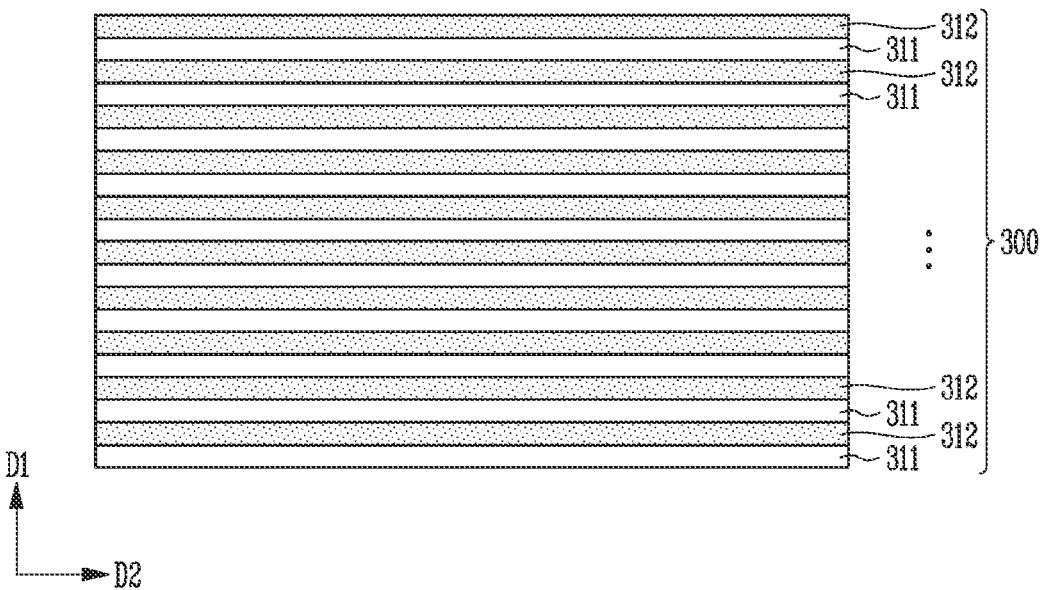

FIGS. 7A to 7B are views illustrating a manufacturing method of a semiconductor memory device in accordance with an embodiment of the present disclosure.

Referring to FIGS. 7A and 7B, a stack structure 300 may be formed on a pre-prepared lower structure (not shown). The lower structure may be various, including a substrate, a doped semiconductor layer, a multi-layer, and the like. First material layers 311 and second material layers 312 may be alternately stacked one by one in the first direction D1 intersecting a surface of the lower structure, thereby forming the stack structure 300. The first material layers 311 and the second material layers 312 may extend in the second direction D2 and the third direction D3 on a plane parallel to the surface of the lower structure.

The first material layers 311 may be configured with a material different from a material of the second material layers 312. In an embodiment, each of the first material layers 311 may include an insulating material, and each of the second material layers 312 may include a conductive material. For example, each of the first material layers 311 may be formed of an oxide layer, such as a silicon oxide layer, and each of the second material layers 312 may include at least one of a doped silicon layer, a metal silicide layer, and a metal layer. Each of the second material layers 312 may use a low-resistance metal, such as tungsten, so as to achieve low resistance wiring. Each of the second material layers 312 may further include a barrier layer, such as a titanium nitride layer, a tungsten nitride layer, or a tantalum nitride layer. The first material layers 311 and the second material layers 312 may be the same components as the interlayer insulating layers ILD and the conductive layers CP, which are described with reference to FIG. 4A.

Figure 8A:
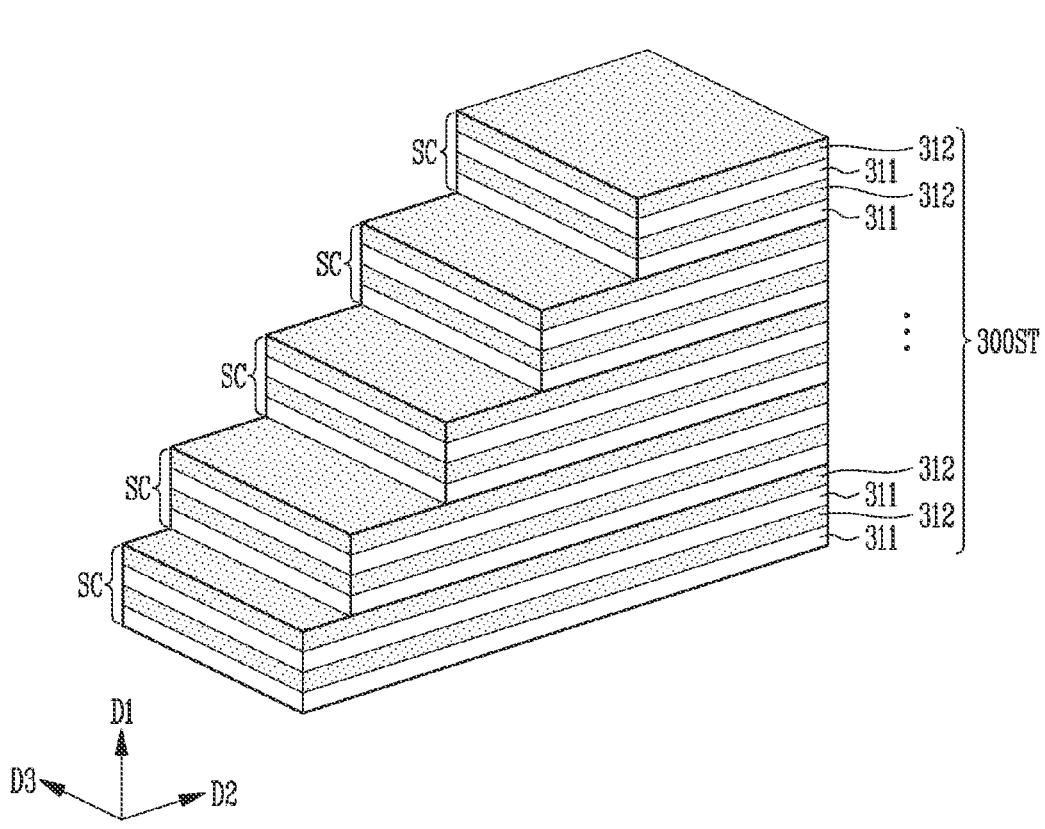
Figure 8B:
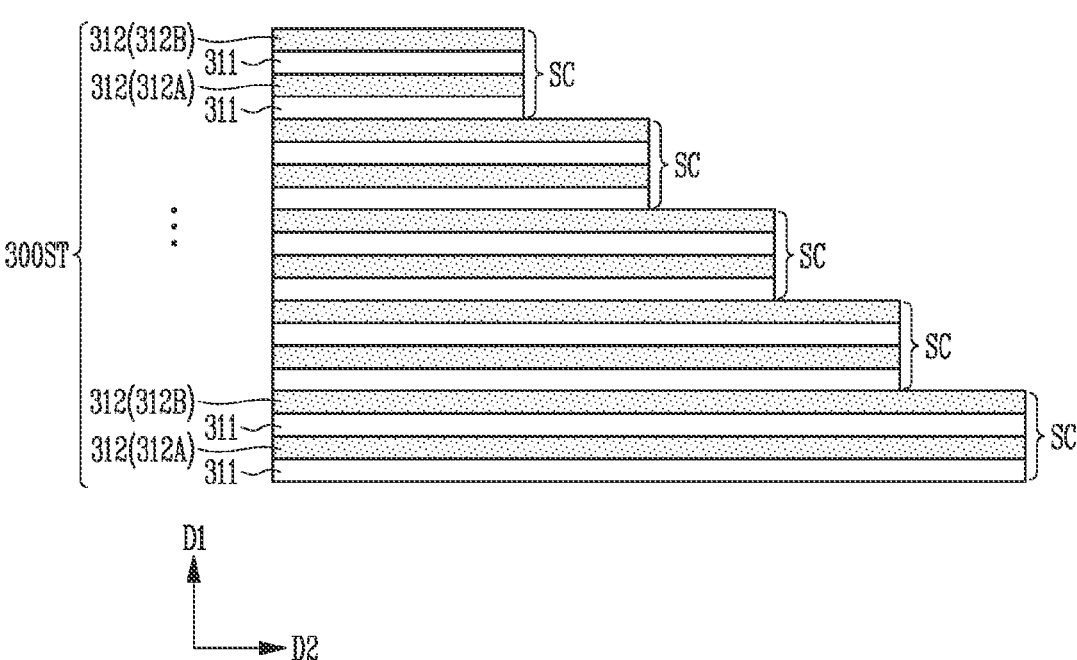

The number of first material layers 311 and second material layers 312 are not limited to the numbers as shown in FIGS. 8A and 8B.

Referring to FIGS. 8A and 8B, the stack structure 300 shown in FIGS. 7A and 7B may be etched in the second direction D2, thereby forming a stepped structure 300ST. The stepped structure 300ST may include a plurality of steps SC. The plurality of steps SC may extend in the second direction D2.

At least two first material layers 311 and at least two second material layers 312 may be simultaneously etched. One step SC may include at least two first material layers 311 and at least two second material layers 312, which are simultaneously etched. The at least two second material layers 312 included in the one step SC may include a lower second material layer 312A and an upper second material layer 312B on the lower second material layer 312A, which are spaced apart from each other in the first direction D1. In an embodiment, upper second material layers 312B may be disposed on the top of respective steps SC of the stepped structure 300ST.

Figure 9A:
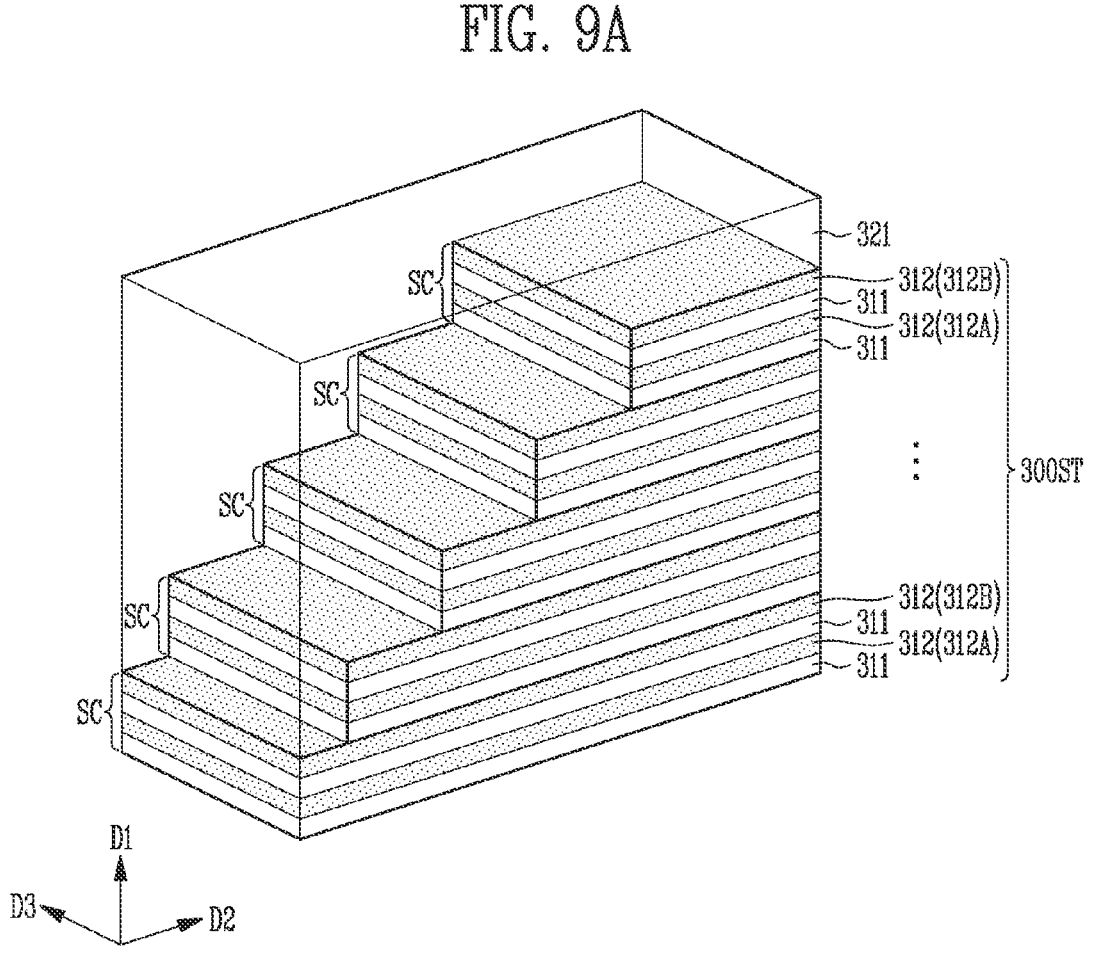
Figure 9B:
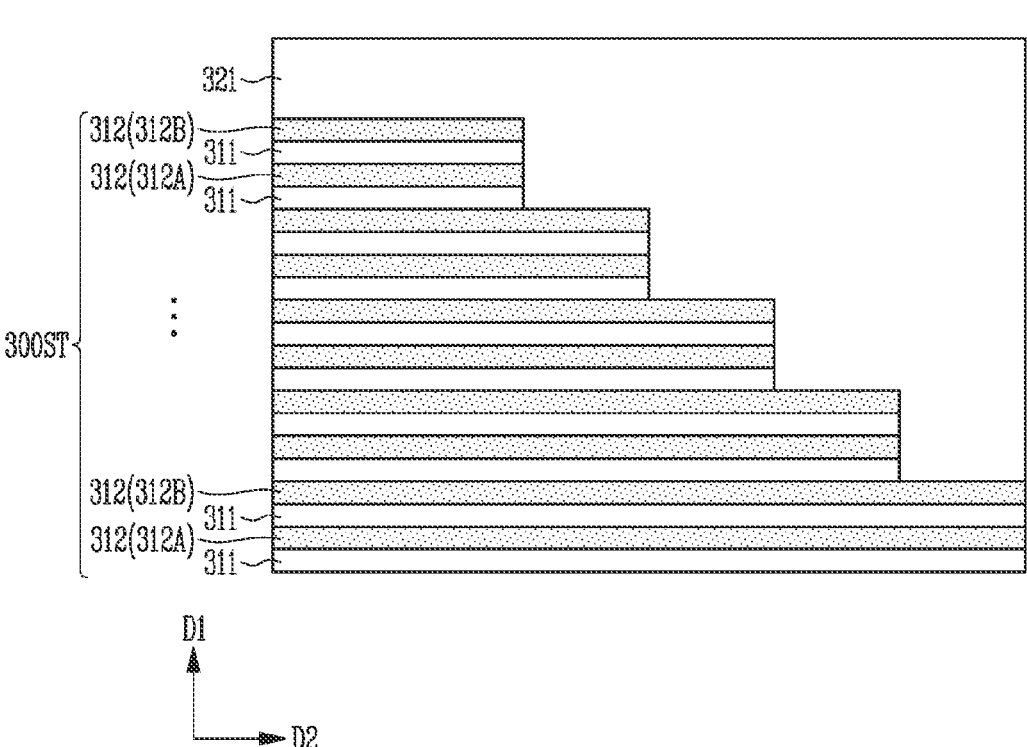

Referring to FIGS. 9A and 9B, an upper insulating layer 321 may be formed over the stepped structure 300ST as shown in FIG. 8A. The stepped structure 300ST may be covered with the upper insulating layer 321. The upper insulating layer 321 may be configured with a material different from the material of the second material layers 312. In an embodiment, the upper insulating layer 321 may include an insulating material having an etch selectivity with respect to the second material layers 312. More specifically, the upper insulating layer 321 may include oxide.

Figure 10A:
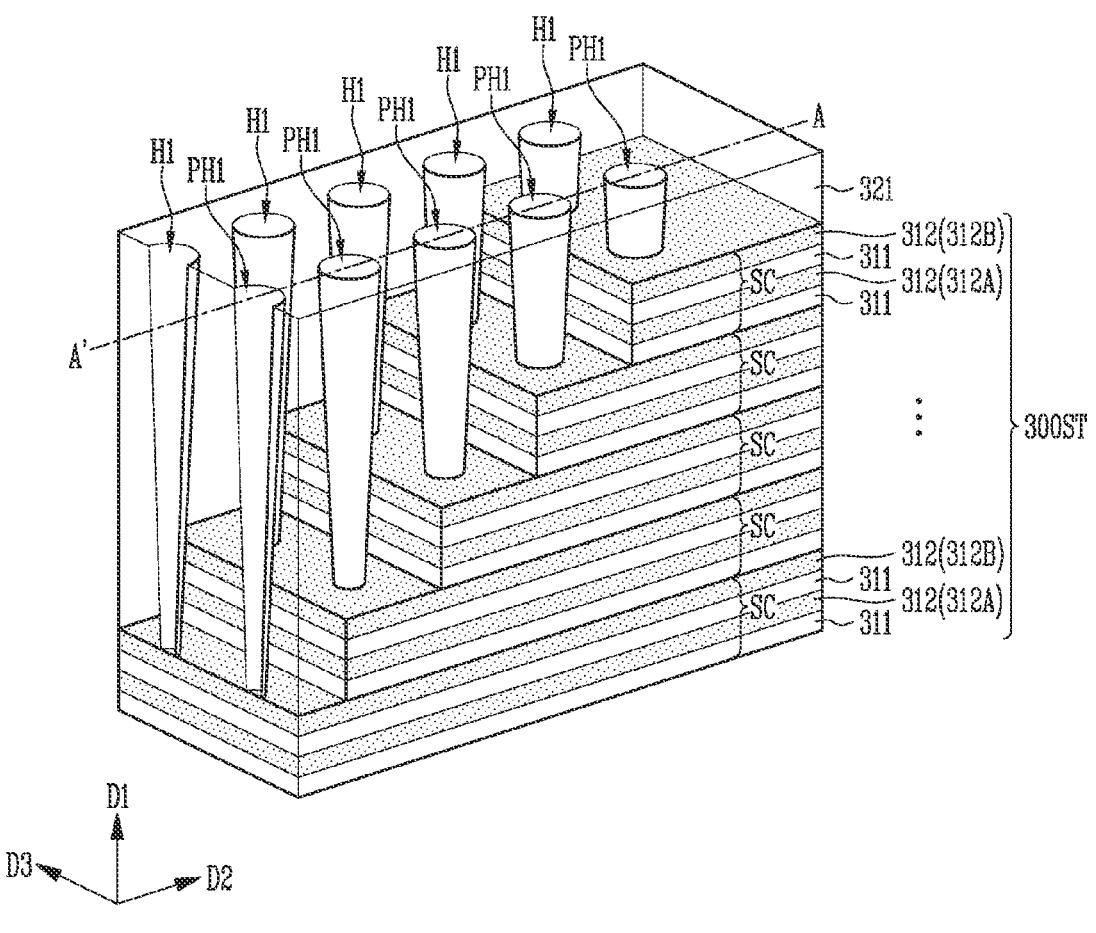
Figure 10B:
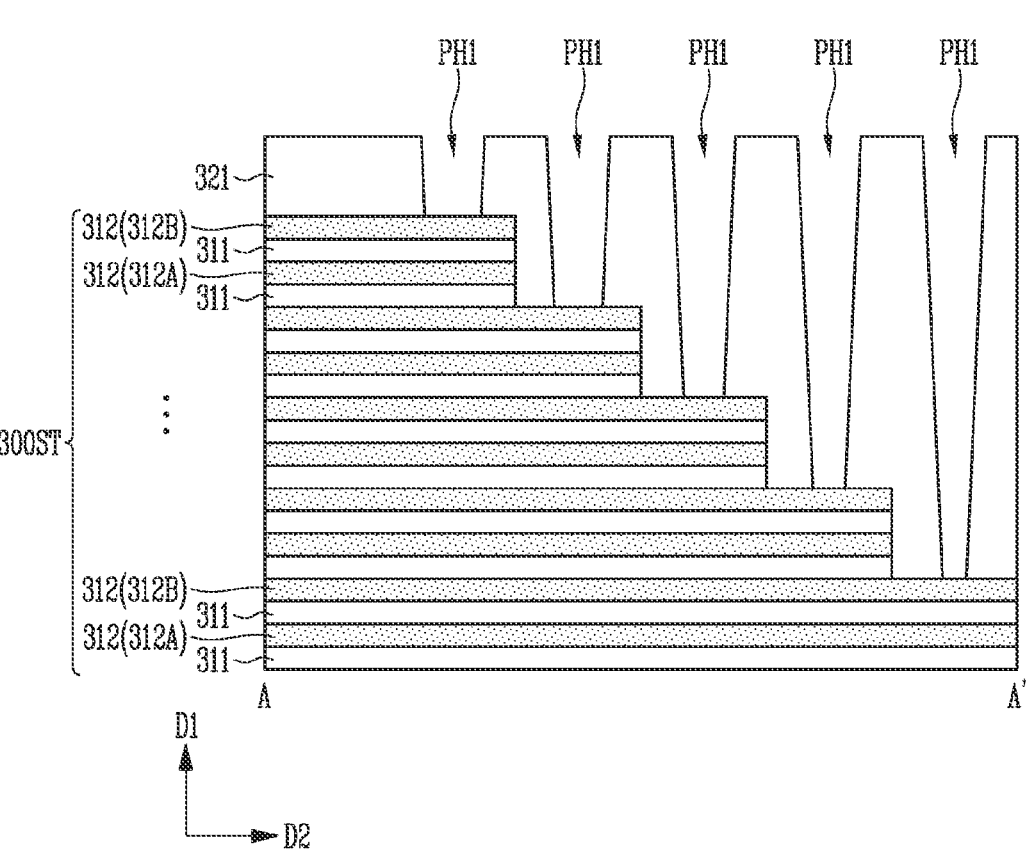

Referring to FIGS. 10A and 10B, first holes H1 and preliminary holes PH1 may be formed to expose the upper second material layers 312B while penetrating the upper insulating layer 321.

When a lower second material layer 312A and an upper second material layer 312B are included in one step SC, at least one first hole H1 and at least one preliminary hole PH1 may be formed. The lower second material layer 312A and the upper second material layer 312B, which are included in the one step SC, may constitute the same step SC. An edge of the lower second material layer 312A included in the one step SC and an edge of the upper second material layer 312B included in the one step SC may be arranged on a straight line in the first direction D1.

The first holes H1 having different lengths on the plurality of steps SC may be arranged in a line in the second direction D2. The preliminary holes PH1 having different lengths on the plurality of steps SC may be arranged in a line in the second direction D2.

Figure 11A:
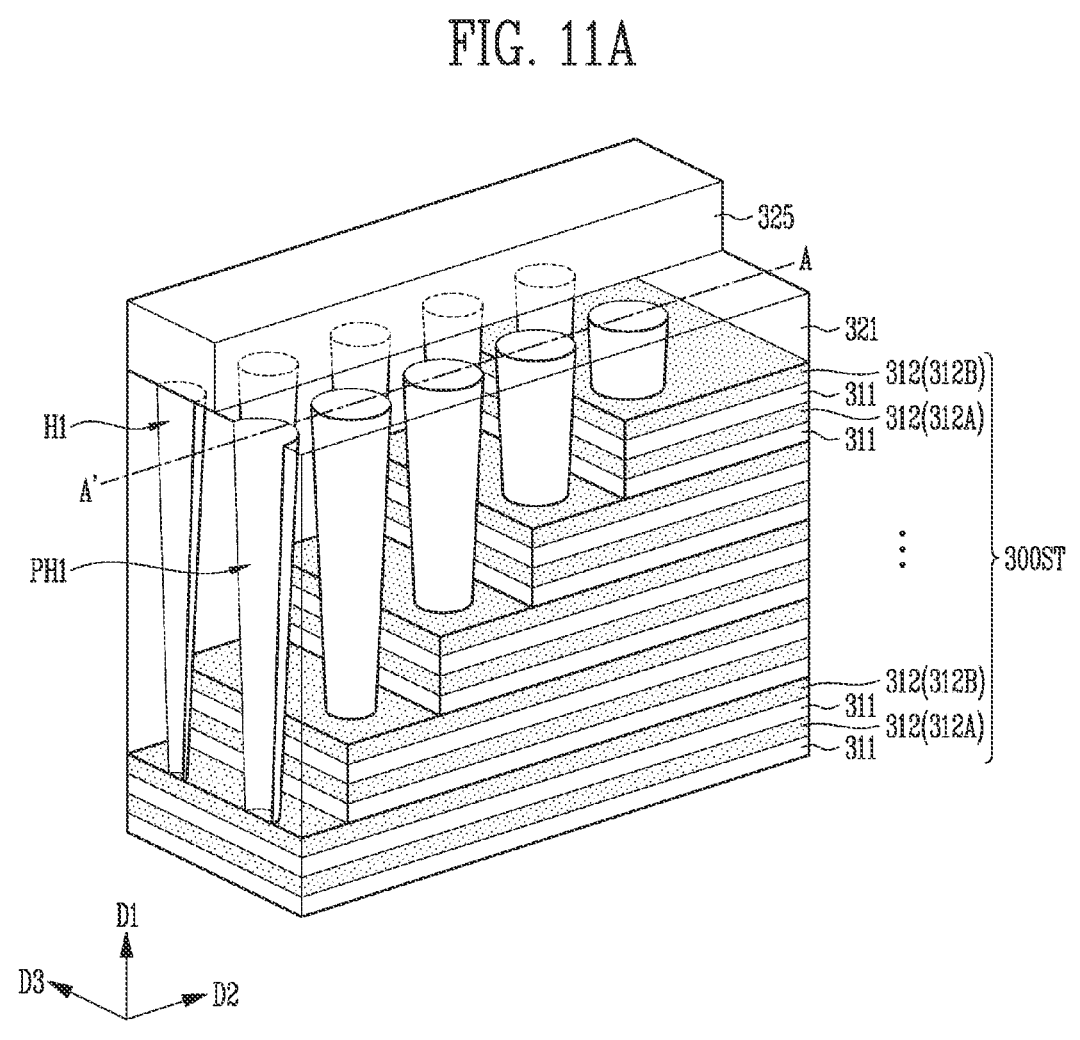
Figure 11B:
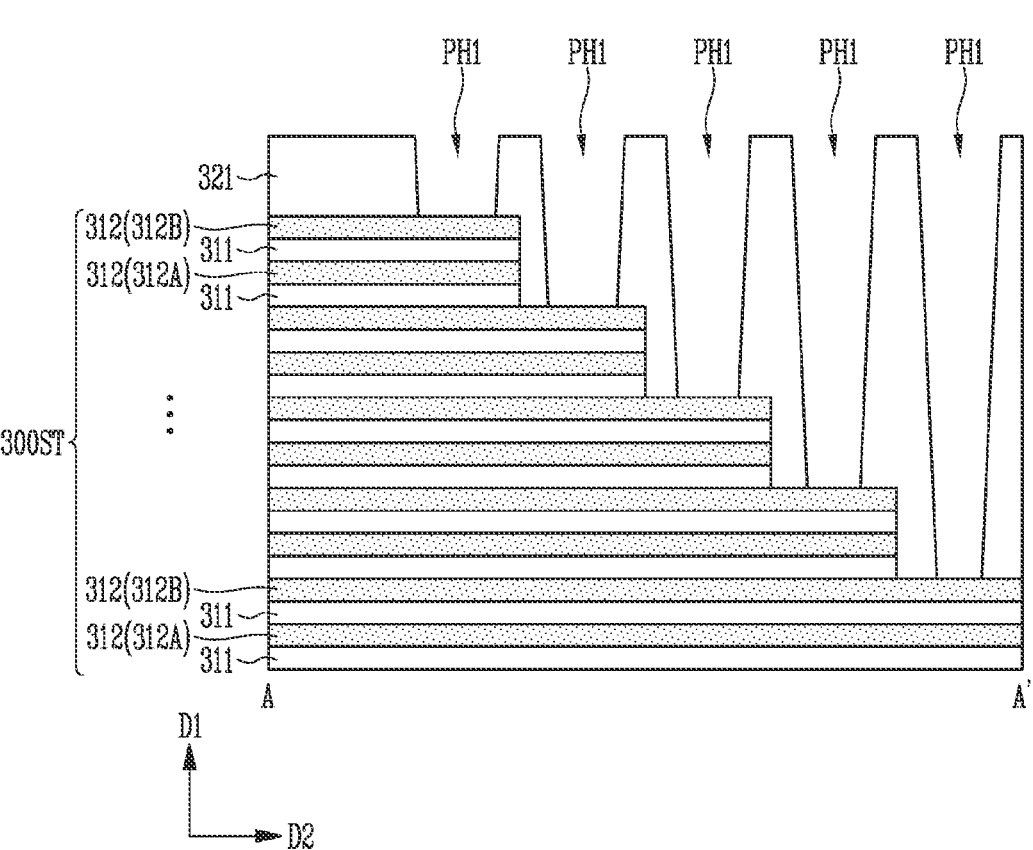

Referring to FIGS. 11A and 11B, a protective layer 325 may be formed, which fills the first holes H1. The protective layer 325 may be provided in a form covering the first holes H1. The protective layer 325 may be used as an etch stop layer when second holes H2 are formed. In an embodiment, the protective layer 325 may be a photoresist pattern defined through a photolithography process.

Figure 12A:
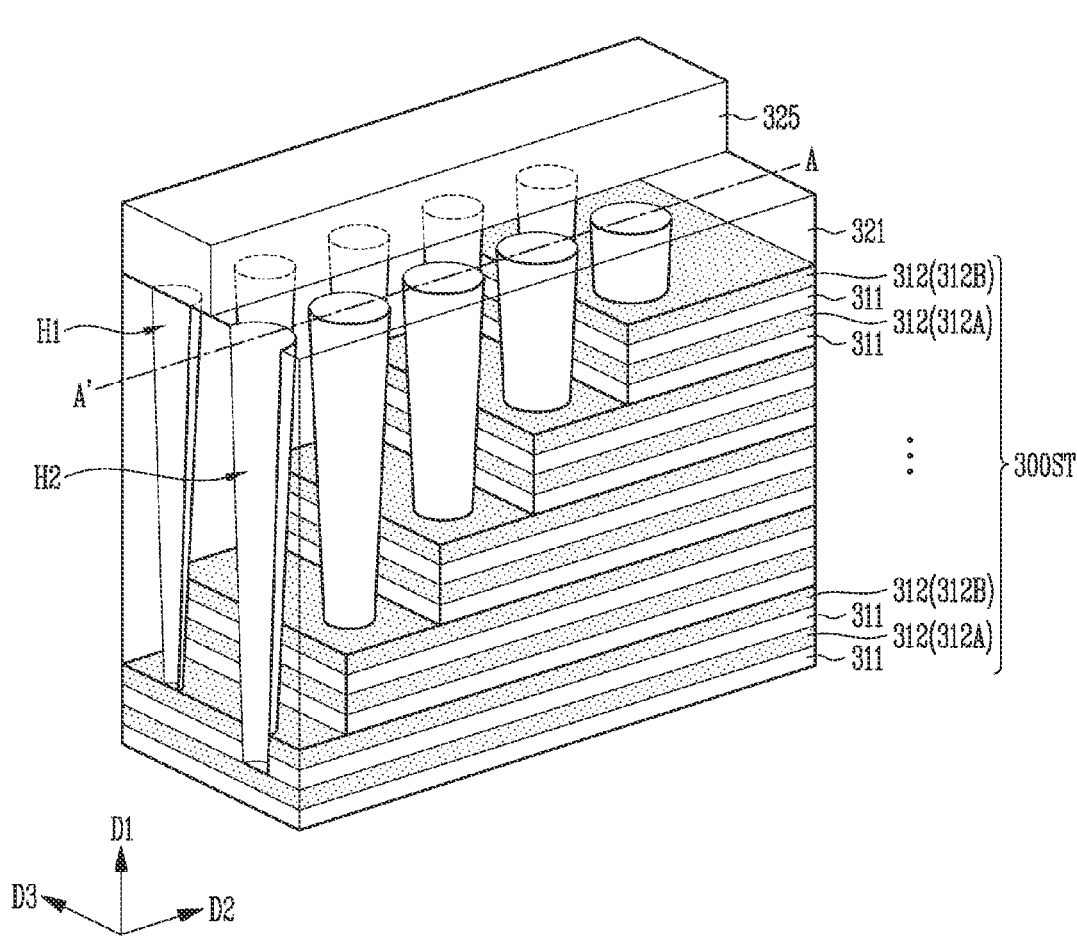
Figure 12B:
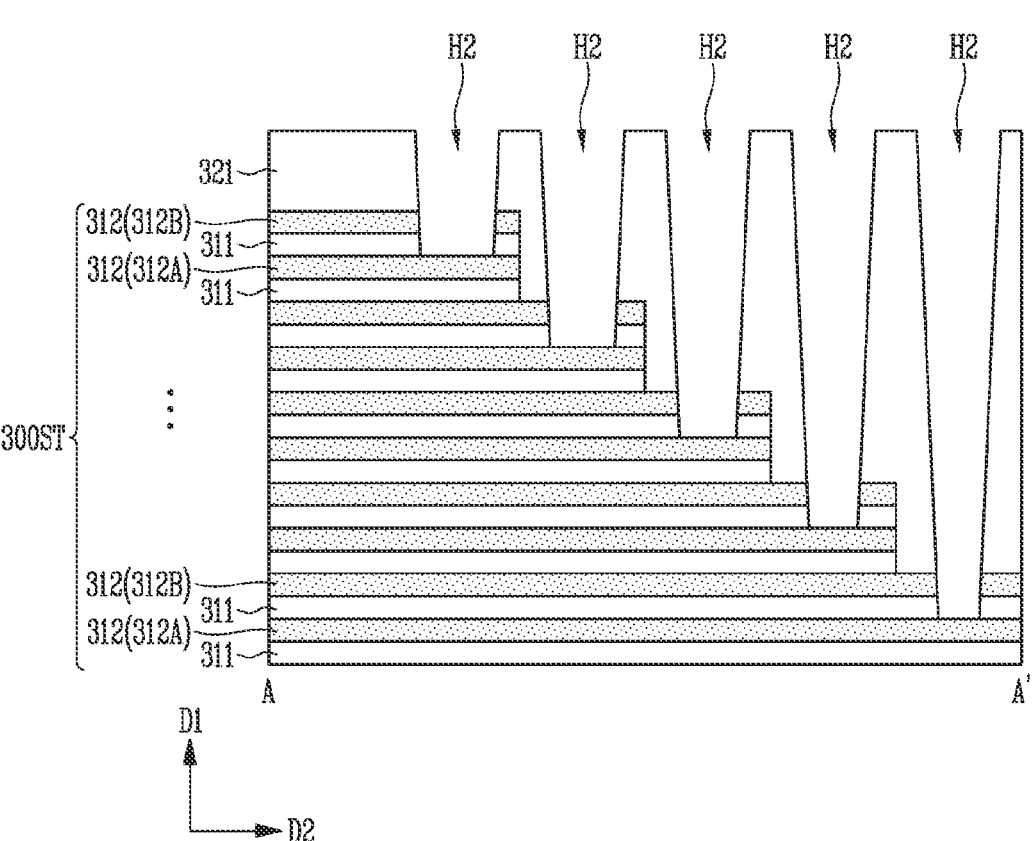

Subsequently, referring to FIGS. 12A and 12B, the second holes H2 may be formed by etching the upper second material layer 312B such that the lower second material layer 312A of the same step SC is exposed through the preliminary holes PH1 as shown in FIGS. 11A and 11B.

Figure 13A:
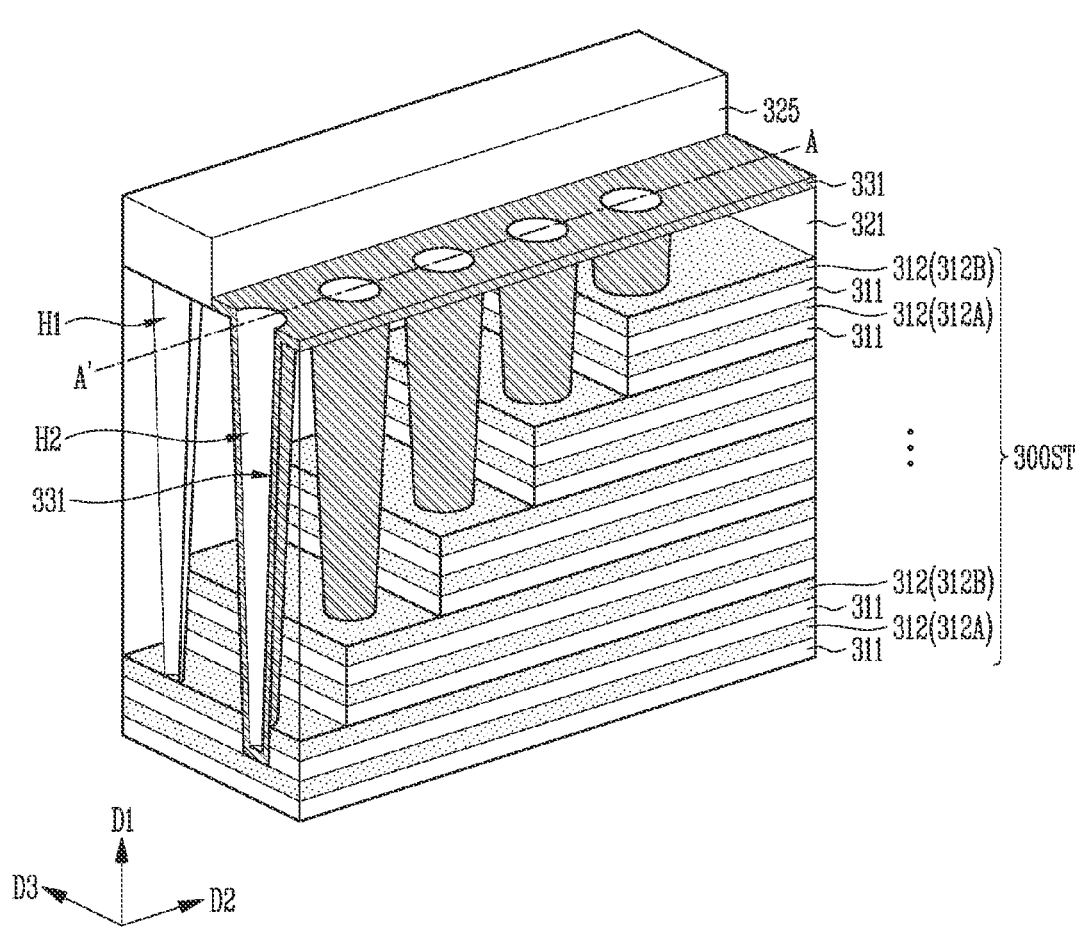
Figure 13B:
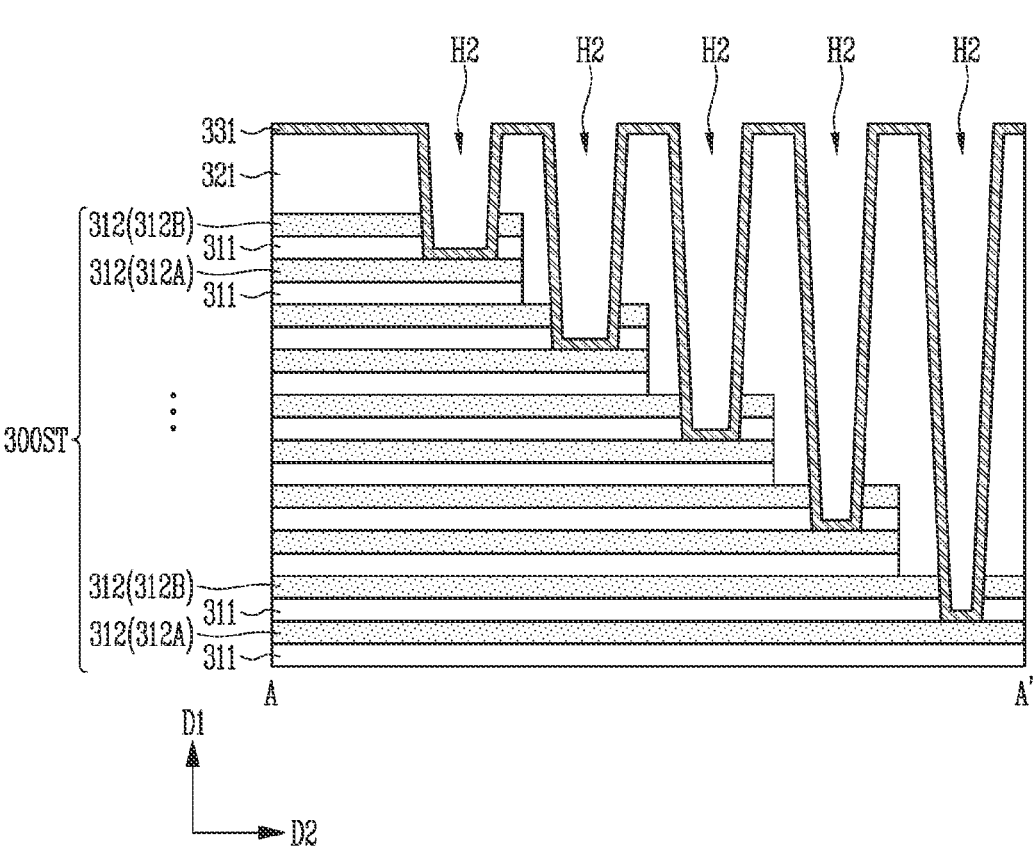

Subsequently, referring to FIGS. 13A and 13B, a sidewall insulating layer 331 may be formed on the stepped structure 300ST and sidewalls of the second holes H2.

Figure 14A:
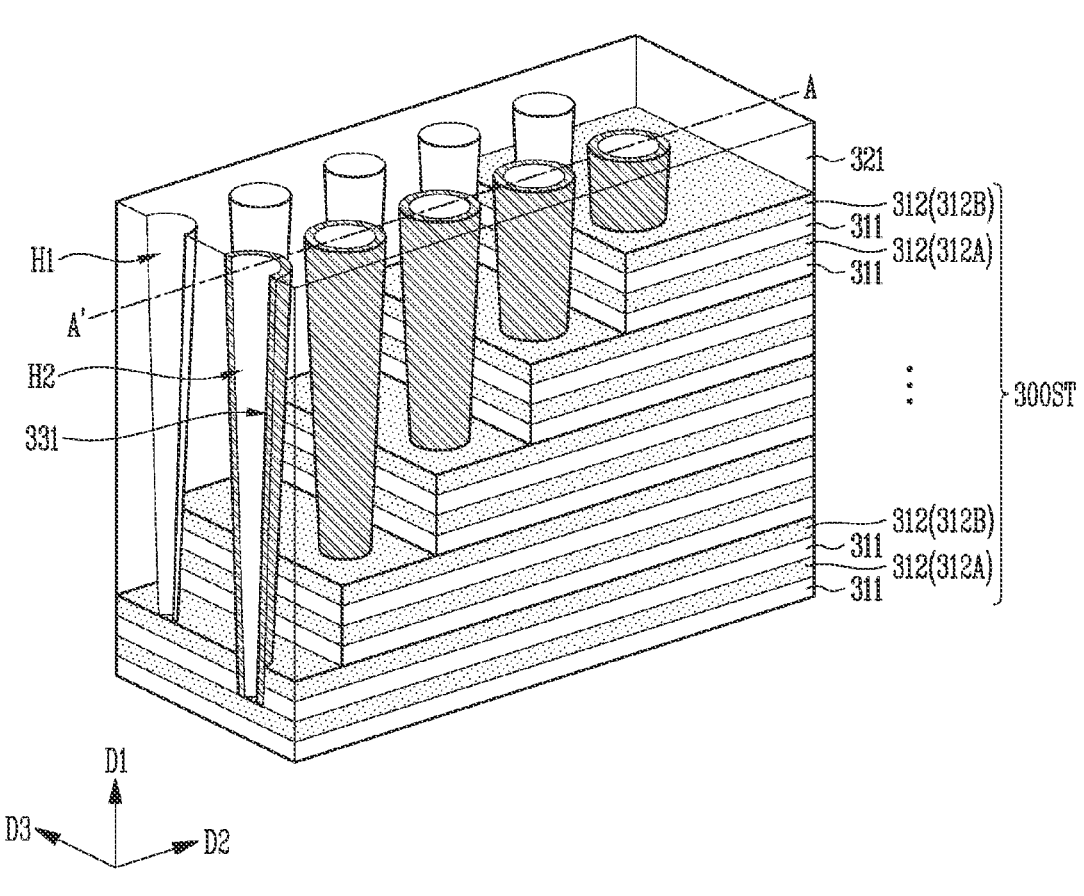
Figure 14B:
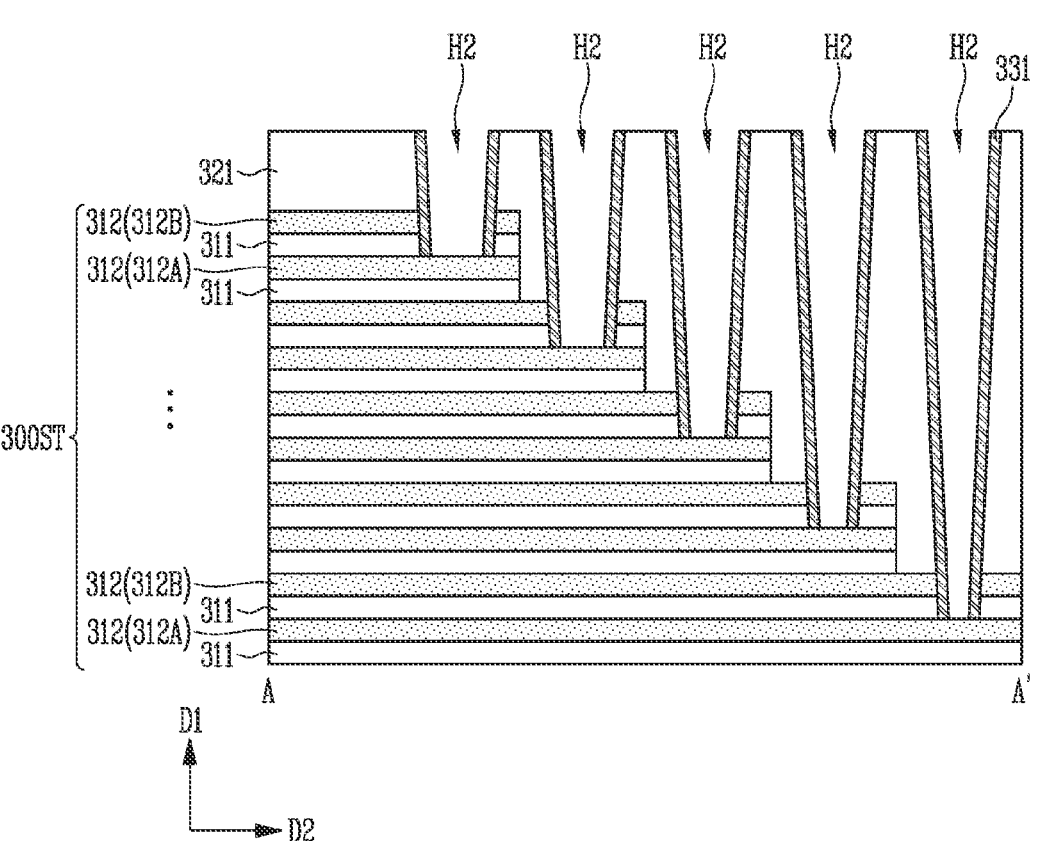

Subsequently, referring to FIGS. 14A and 14B, the sidewall insulating layer 331 on the stepped structure 300ST may be removed.

Figure 15A:
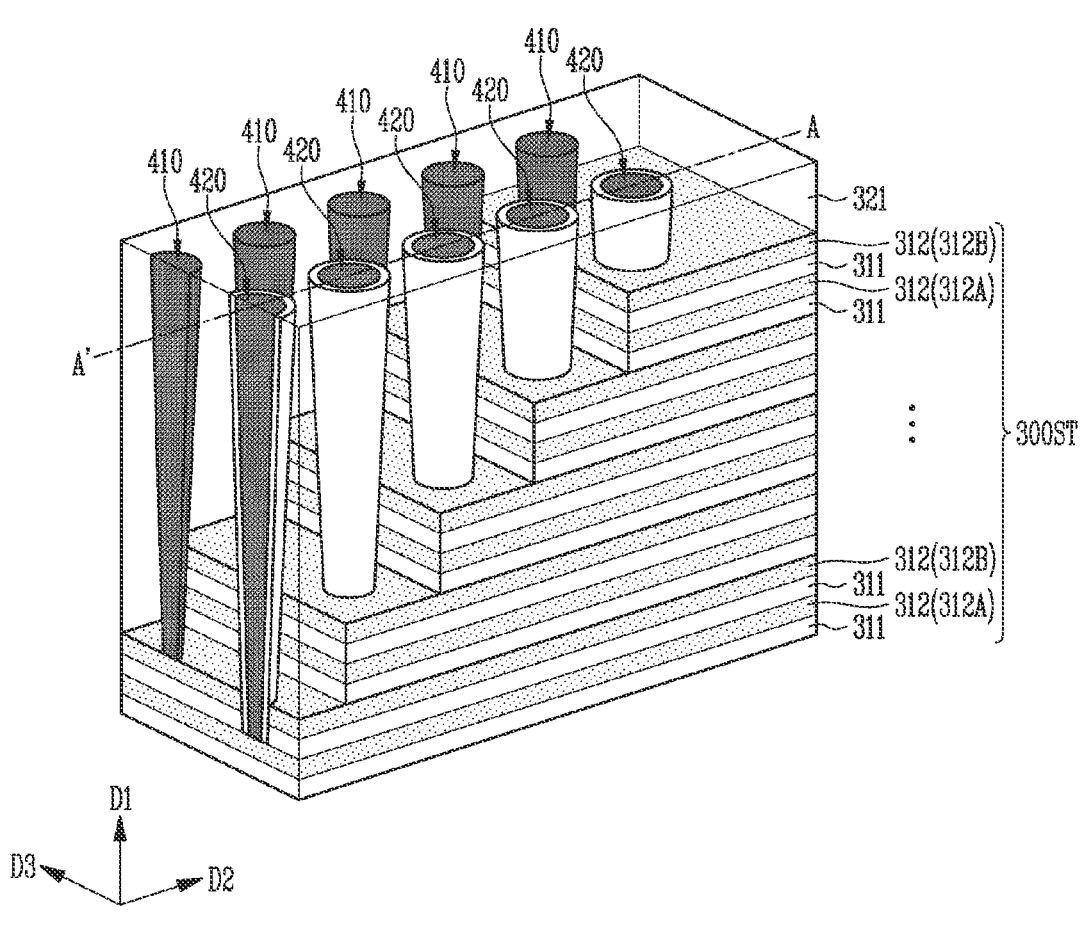
Figure 15B:
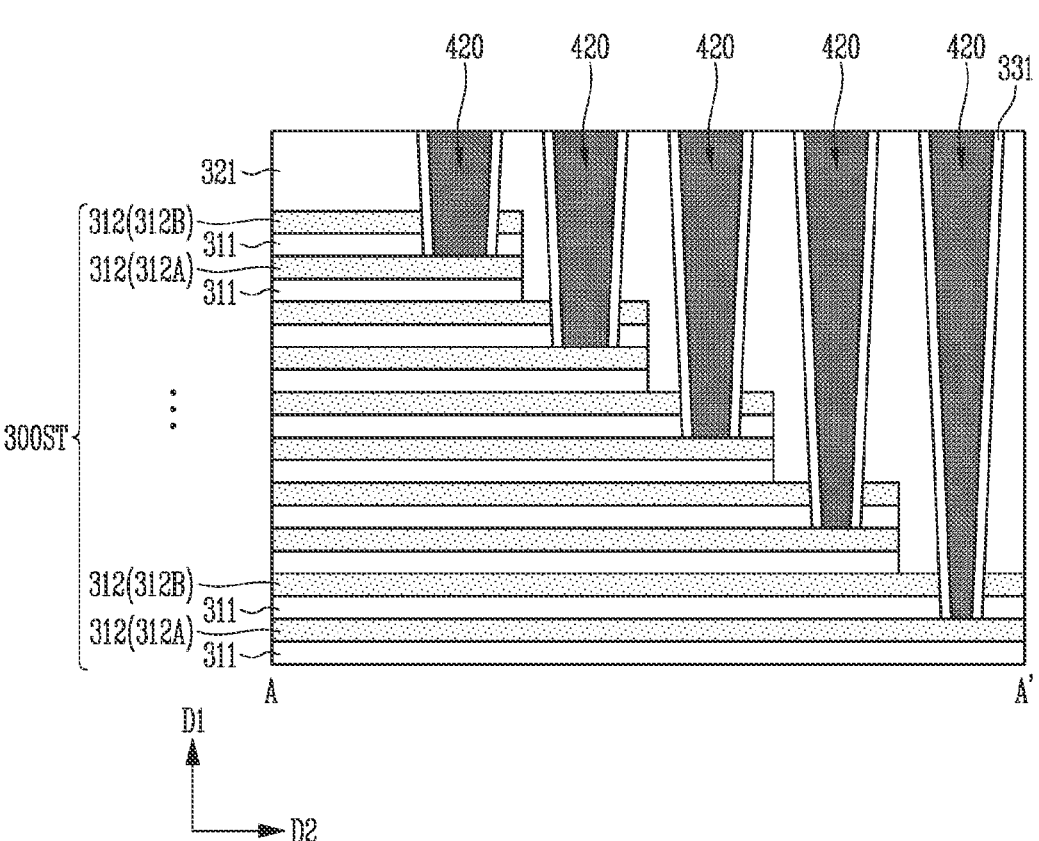

Subsequently, referring to FIGS. 15A and 15B, first contact plugs 410 and second contact plugs 420 may be respectively formed inside the first holes H1 and the second holes H2, shown in FIGS. 14A and 14B. The second material layers 312 may be connected to the peripheral circuit structure PC, shown in FIG. 2, through the first contact plugs 410 and the second contact plugs 420.

Figure 16:
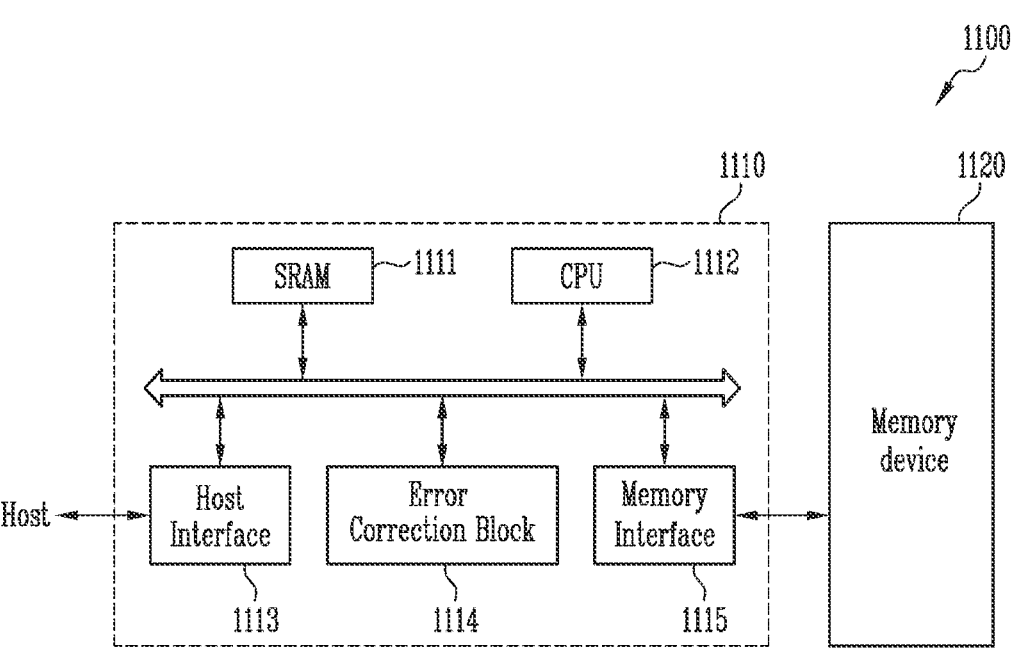
FIG. 16 is a block diagram illustrating a configuration of a memory system in accordance with an embodiment of the present disclosure.

FIG. 16 is a block diagram illustrating a configuration of a memory system in accordance with an embodiment of the present disclosure.

Referring to FIG. 16, the memory system 1100 may include a memory device 1120 and a memory controller 1110.

The memory device 1120 may be a multi-chip package configured with a plurality of flash memory chips. The memory device 1120 may be a nonvolatile memory. Also, the memory device 1120 may have the structure described above with reference to FIGS. 1 to 6 and may be manufactured according to the manufacturing method described above with reference to FIGS. 7A to 15B. In an embodiment, the memory device 1120 may include a stack structure in which a cell region and a slimming region are defined, and interlayer insulating layers and conductive layers are alternately stacked; vertical channel structures penetrating the stack structure in the cell region; and contact plugs connected to the conductive layers in the slimming region. The stack structure may include a stepped structure having a plurality of steps in the slimming region. One step among the plurality of steps may include at least two interlayer insulating layers among the interlayer insulating layers and at least two conductive layers among the conductive layers. The contact plugs may have at least two contact plugs respectively connected to the at least two conductive layers. The structure of the memory device 1120 is identical to the structure described above, and therefore, detailed descriptions will be omitted.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect an error included in a data read from the memory device 1120 and may correct the detected error. The memory interface 1115 may interface with the memory device 1120. The memory controller 1110 may further include a Read Only Memory (ROM) for storing code data for interfacing with the host, and the like.

The memory system 1100 configured as described above may be a memory card or a Solid State Disk (SSD) in which the memory device 1120 is combined with the memory controller 1110. For example, when the memory system 1100 is an SSD, the memory controller 1110 may communicate with an external device (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

In accordance with the present disclosure, a defect which may occur through a manufacturing process between a stepped structure in a slimming region and contact plugs on the stepped structure can be reduced. Accordingly, the stability of a manufacturing process of the semiconductor memory device can be enhanced, and the operational reliability of the semiconductor memory device can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A semiconductor memory device comprising:
   a stack structure including interlayer insulating layers and conductive layers, which are alternately stacked therein; and
   a plurality of contact plugs formed vertical on the conductive layers,
   wherein the stack structure is configured to have a stepped structure,
   wherein each of a plurality of steps included in the stepped structure includes at least two interlayer insulating layers, among the interlayer insulating layers, and at least two conductive layers, among the conductive layers, and
   wherein the plurality of contact plugs include at least two contact plugs respectively connected to the at least two conductive layers included in each of the plurality of steps,
   wherein the at least two conductive layers included in each of the plurality of steps include a lower conductive layer and an upper conductive layer above the lower conductive layer, wherein the at least two contact plugs include a first contact plug connected to the lower conductive layer and a second contact plug connected to the upper conductive layer, wherein the first contact plug penetrates the upper conductive layer, and wherein, in a direction in which the upper conductive layer extends, the upper conductive layer surrounds the first contact plug.

2. The semiconductor memory device of claim 1, further comprising a sidewall insulating layer surrounding a sidewall of the first contact plug.

3. A semiconductor memory device comprising:

a stack structure including a slimming region, the slimming region of the stack structure having a stepped structure; and a first contact plug and a second contact plug in contact with a plurality of steps included in the stepped structure, the first contact plug and the second contact plug having different lengths, wherein the stack structure includes:

a first conductive layer in contact with the first contact plug; and a second conductive layer, spaced apart from the first conductive layer, in contact with the second contact plug, wherein the first contact plug penetrates the second conductive layer, and wherein, in a direction in which the second conductive layer extends, the second conductive layer surrounds the first contact plug.

4. The semiconductor memory device of claim 3, wherein side surfaces of the first conductive layer and the second conductive layer, which are included in the same step among the plurality of steps, are exposed along a side surface of the same step.

5. The semiconductor memory device of claim 3, wherein the first conductive layer and the second conductive layer have the same length.

6. The semiconductor memory device of claim 3, wherein the second contact plug is in contact with a top surface of the second conductive layer.

7. The semiconductor memory device of claim 3, wherein the second contact plug is spaced apart from the first conductive layer.

8. The semiconductor memory device of claim 3, further comprising a sidewall insulating layer surrounding a sidewall of the first contact plug.

9. The semiconductor memory device of claim 8, wherein the first contact plug is spaced apart from the second conductive layer by the sidewall insulating layer.

10. The semiconductor memory device of claim 3, wherein the stack structure extends to a cell region adjacent to the slimming region.

11. The semiconductor memory device of claim 10, further comprising a plurality of vertical channel structures penetrating the stack structure formed in the cell region.

12. The semiconductor memory device of claim 11, wherein the plurality of vertical channel structures include a plurality of memory cells.

13. A method of manufacturing a semiconductor memory device, the method comprising:

forming a stack structure including first and second conductive layers on a lower structure;

etching the stack structure to form a stepped structure including steps, wherein each of the steps includes a first conductive layer among the first conductive layers and a second conductive layer among the second conductive layers;

forming an upper insulating layer on the top of the stack structure having the stepped structure;

forming a plurality of first holes that expose the second conductive layers while penetrating the upper insulating layer;

forming a plurality of second holes that expose the first conductive layers while penetrating the second conductive layers, wherein, in a direction in which each of the second conductive layers extends, each of the second conductive layers surrounds a corresponding one of the plurality of second holes;

forming a sidewall insulating layer on sidewalls of the second holes; and forming a plurality of first contact plugs and a plurality of second contact plugs inside the plurality of first holes and inside the plurality of second holes, respectively.

14. The method of claim 13, wherein, in the stack structure, the first conductive layers and the second conductive layers are alternately stacked.

15. The method of claim 13, wherein the forming of the second holes includes:

simultaneously forming preliminary holes that expose the second conductive layers when the plurality of first holes are formed;

forming a protective layer that fill the plurality of first holes, the protective layer exposing the second conductive layers through the preliminary holes; and exposing the first conductive layers by etching the second conductive layers exposed through the preliminary holes.

16. The method of claim 15, further comprising removing the protective layer after the sidewall insulating layers are formed.

17. The method of claim 13, further comprising forming a plurality of vertical channel structures that penetrate the stack structure in a cell region of the stack structure before the forming of the stepped structure.

* * * * *